United States Patent
Clabes et al.

(10) Patent No.: US 6,951,002 B2
(45) Date of Patent: Sep. 27, 2005

(54) DESIGN TECHNIQUES FOR ANALYZING INTEGRATED CIRCUIT DEVICE CHARACTERISTICS

(75) Inventors: Joachim Gerhard Clabes, Austin, TX (US); Anand Haridass, Austin, TX (US); Michael F. Wang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 10/455,164

(22) Filed: Jun. 5, 2003

(65) Prior Publication Data

US 2004/0250228 A1 Dec. 9, 2004

(51) Int. Cl.$^7$ .............................................. G06F 17/50
(52) U.S. Cl. ................................ 716/5; 716/7; 716/8
(58) Field of Search ............................. 716/5, 7, 8, 1

(56) References Cited

U.S. PATENT DOCUMENTS 6,523,159 B2 * 2/2003 Bernstein et al. ............. 716/10
6,721,924 B2 * 4/2004 Patra et al. ..................... 716/2

OTHER PUBLICATIONS

Hough et al., "New Approaches for On–Chip Power Switching Noise Reduction", May 1995, Proceedings of the IEEE 1995 Custom Integrated Circuits Conference, pp. 133–136.*

Chen et al., "On–Chip Decoupling Capacitor Optimization for High–Performance VLSI Design", May 1995, IEEE, Proceedings of Technical Papers, International Symposium on VLSI Technology, Systems, and Applications, pp. 99–103.*

* cited by examiner

*Primary Examiner*—Matthew Smith
*Assistant Examiner*—Sun James Lin
(74) *Attorney, Agent, or Firm*—Duke W. Yee; Casimer K. Salys; Wayne P. Bailey

(57) ABSTRACT

An improved method and system for integrated circuit device physical design and layout. The physical layout of the integrated circuit device is optimally stored in a database to provide improved analysis capabilities of the integrated circuit device's characteristics. The method and system evaluates local interactions between functional blocks and decoupling cells on a given floor plan of a chip using this optimized database in order to reduce memory and processor utilization. Local noise is projected by using dI/dt and capacitance estimates. Areas of highest noise concern are identified, and floor plan mitigation actions are taken by tuning the placement of neighboring decoupling cells and their properties. Upon several iterative cycles, a near optimal solution for a given floor plan of the total chip is achieved.

25 Claims, 6 Drawing Sheets

DESIGN TECHNIQUES FOR ANALYZING INTEGRATED CIRCUIT DEVICE CHARACTERISTICS

BACKGROUND OF THE INVENTION

1. Technical Field

The present invention relates to integrated circuit device design, and more particularly to integrated circuit design techniques to mitigate on-chip noise of such device.

2. Description of Related Art

Improvements in manufacturing processes are enabling integrated circuit devices to offer more functionality as the size of individual transistors contained therein get smaller and smaller, thus allowing more transistors to be packaged within an integrated circuit device. As the trend of integrating more functions in a single high performance integrated circuit device (also called a chip) continues, the on-chip noise condition due to switching activity on the chip has become a major new challenge. In addition, as the power density increases with each technology generation (for example, 0.25 micron line widths, 0.18 micron line widths, 0.13 micron line widths, etc.), it becomes increasingly difficult to provide adequate power distribution when the power grid structure is shrinking at a similar rate to that of the power consuming gates/transistors. High frequency noise is impeding the desired increase in clock cycle time and improved reliability for these highly integrated systems on a chip. In order to optimally mitigate the noise impact, a systematic chip-wide approach is needed since the worst conditions anywhere on the chip will become the ultimate limiter or bottleneck.

Today, a highly integrated chip typically contains greater than 100,000 placeable objects or macros. In order to analyze and optimize the interaction between these objects/macros, a computer database with reduced memory usage and a highly efficient algorithm is needed.

SUMMARY OF THE INVENTION

An improved method and system for integrated circuit device physical design and layout. The physical layout of the integrated circuit device is optimally stored in a database to provide improved analysis capabilities of the integrated circuit device's characteristics. The method and system evaluates local interactions between functional blocks and decoupling cells on a given floor plan of a chip using this optimized database in order to reduce memory and processor utilization. Local noise is projected by using dI/dt and capacitance estimates. Areas of highest noise concern are identified, and floorplan mitigation actions are taken by tuning the placement of neighboring decoupling cells and their properties. Upon several iterative cycles, a near optimal solution for a given floorplan of the total chip is achieved.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
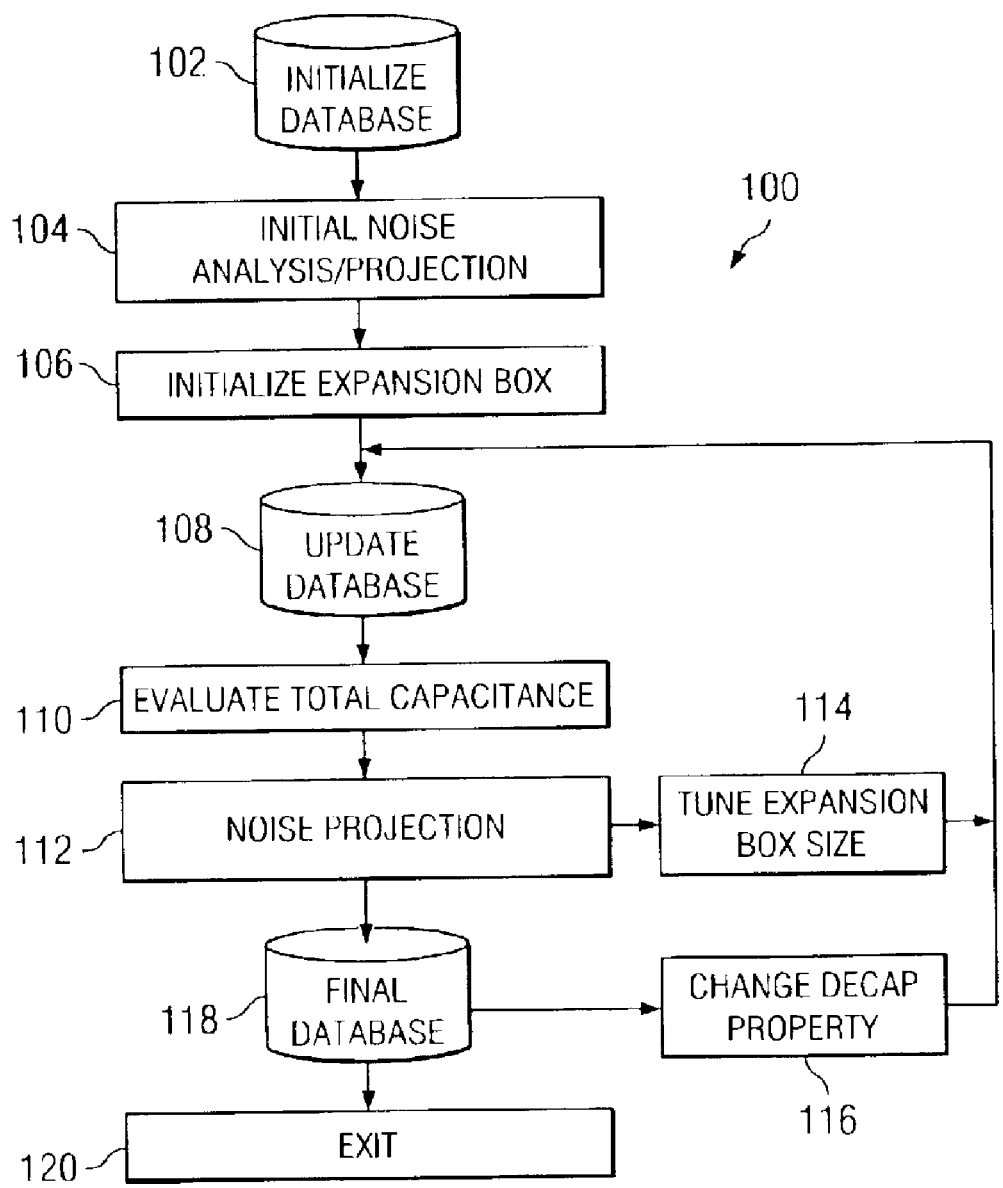
FIG. 1 depicts the overall design flow for on-chip noise mitigation of an integrated circuit device.

The method and procedure for improving noise characteristics of an integrated circuit device is shown generally at 100 in FIG. 1. The database is initialized at 102 with initial information, including chip level floor plan information such as size and position of all objects, macro specific data such as current signature and intrinsic capacitance of the macro, and decoupling capacitor (decap) properties such as capacitance and response time. Using the above described initial database information, the intrinsic noise level for the device is projected at 104. Each macro for the chip is given an initial expansion/boundary box size at 106. The expansion/boundary box is a variable-sized, logical perimeter around the physical macro, as will be further described below. Database 108 is used to evaluate the total capacitance for each boundary box at 110. In similar fashion to the initial noise analysis done at 104, the noise for each boundary box and its associated capacitance is projected at 112. The size of each boundary box is then tuned at 114, depending upon whether the associated noise is above or below a noise threshold. For example, for macros having projected noise above the noise threshold, the associated boundary box is made bigger. For macros having projected noise below the noise threshold, the associated boundary box is made smaller. The updated database 108 is again used to evaluate total capacitance for each boundary box at 110, and to project noise for the macro within each expansion at 112. This process iteratively loops for forty times in the preferred embodiment. Once the boundary box sizes have been finally sized based on such iteratively looping, a fine tuning of decoupling capacitor properties is performed at 116, where decap cells having different properties are swapped into local areas still having projected excessive noise. The database is updated accordingly at 108, capacitance evaluated at 110, and noise projections are again determined at 112. This fine tuning by decap cell swapping then repeats for one or two more iterations in the preferred embodiment, finally resulting in a final database at 118, where the process then exits at 120. Many of these internal processes will now be described in more detail.

Database 102

There are currently more than 60,000 macros and 300,000 decoupling capacitors (decaps) on a typical processor or system-on-a-chip (SOC) integrated circuit device. This represents a very large data set which grows with each new generation of technology. In order to deal with such large volume of data, memory usage becomes a critical aspect of an optimization process for the whole chip/device. Cells sharing common information are grouped together and indexed. A single copy of the common information is stored in memory, in a hash table for fast lookup, with each cell associated with an index identifier.

The principal algorithm uses a procedure to find all cells (macros and decaps) that fall in, or partially in, a given boundary box. Since this procedure is frequently used, the database is optimized to reduce search time. In order to avoid searching every cell, the chip is broken up into a matrix of smaller blocks. Cells or pointers of cells are stored in the matrix at location(s) where they belong. This way, cells are searched only if they are stored in matrix locations covered by the particular boundary box.

Figure 2:
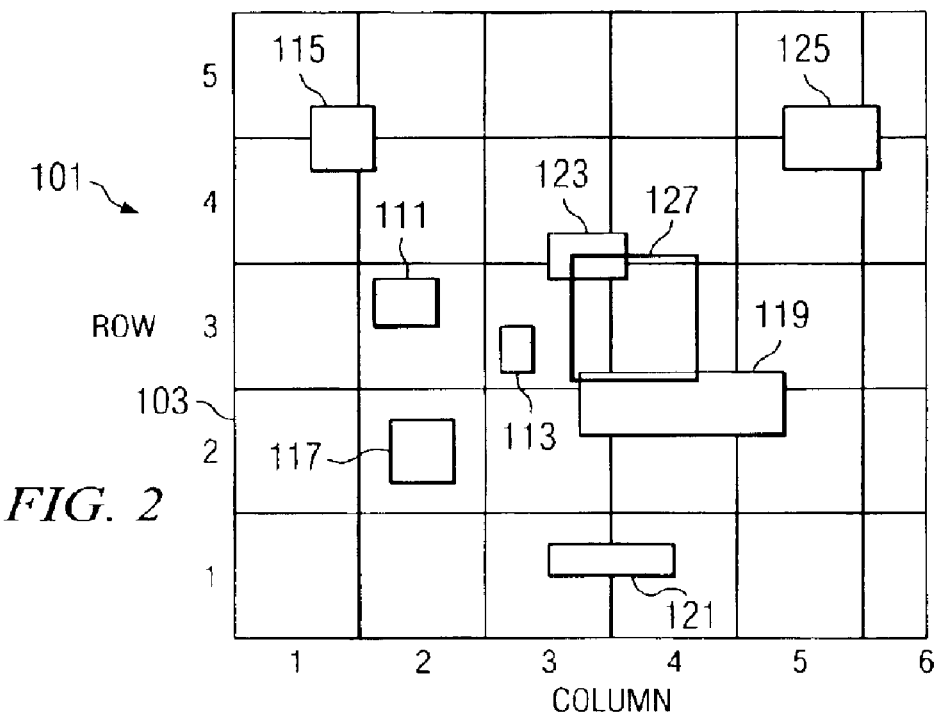
FIG. 2 depicts a representative chip floor plan broken up into a matrix of smaller blocks.

For example, as shown in FIG. 2, there is shown a representative chip floor plan 101 containing eight cells 111, 113, 115, 117, 119, 121, 123 and 125. This chip floor plan is shown being broken up into an M row by N column matrix 103, in this case M=5 and N=6. Other matrix sizes are also possible. Cells or pointers of cells are stored in the matrix 103 at location(s) where they belong. For example, cell 117 is stored in Matrix (2,2) since it is fully contained within that matrix location. Cell 121 is stored in Matrix (1,3) and Matrix (1,4) since it spans across two matrix locations.

Similarly, cell 119 is stored in Matrix (2,3), Matrix (2,4), Matrix (2,5), Matrix (3,3), Matrix (3,4) and Matrix (3,5) as it spans these matrix locations. The other remaining cells 111, 113, 115, 123 and 125 are similarly stored in the matrix 103 at location(s) where they belong. In order to find all cells that are within, or overlap, a boundary box such as 127, only matrix locations covered by the particular boundary box need to be searched. With the example shown in FIG. 2, in order to find all cells that overlap boundary box 127, only the matrix locations Matrix (3,3), Matrix (3,4), Matrix (4,3) and Matrix (4,4) need to be searched to locate the cell or cell pointer information.

Evaluate Macro Intrinsic Capacitance in a Given Boundary Box (Step 110)

Figure 3:
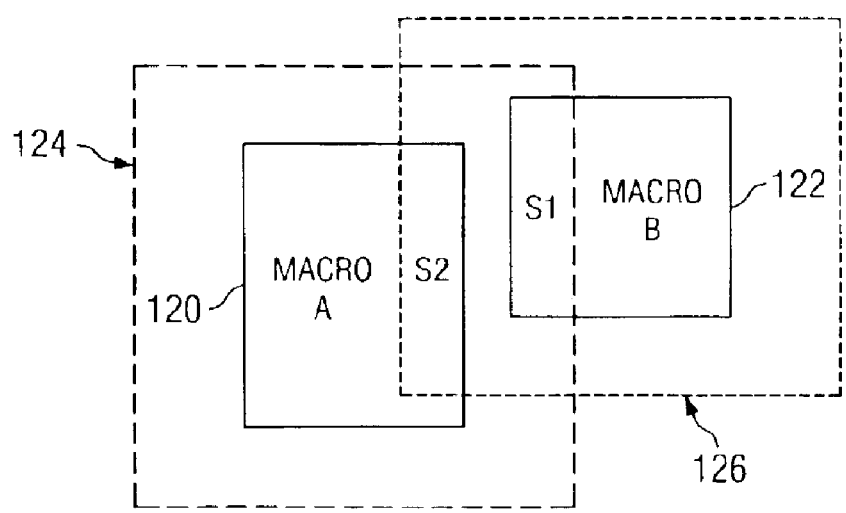
FIG. 3 depicts two neighboring macros and their respective logical boundary boxes.

The intrinsic capacitance associated with a given block (e.g. Macro A shown in FIG. 3) is part of the total capacitance which counteracts the dI/dt noise induced by its switching activity. This capacitance contains two components—(1) the self quiet capacitance related to non-switching parts of the circuits in Macro A, and (2) parts of a neighboring block (e.g. Macro B shown in FIG. 3) provided such neighboring block falls within a range of interaction defined by a given boundary box around Macro A. However, if a macro (or portions of a macro) is included in another macro's boundary box, its intrinsic capacitance is shared with the other macro. For example, with reference to FIG. 3, see Macro A at 120 and Macro B at 122. Part of Macro A is within Macro B's boundary box 126, as shown by cross-hatched area S2. Therefore, the capacitance in area S2 is shared by both Macro A and Macro B. In similar fashion, part of Macro B is within Macro A's boundary box 124, as shown by cross-hatched area S1. The capacitance in area S1 is also shared by both Macro A and Macro B.

Figure 4:
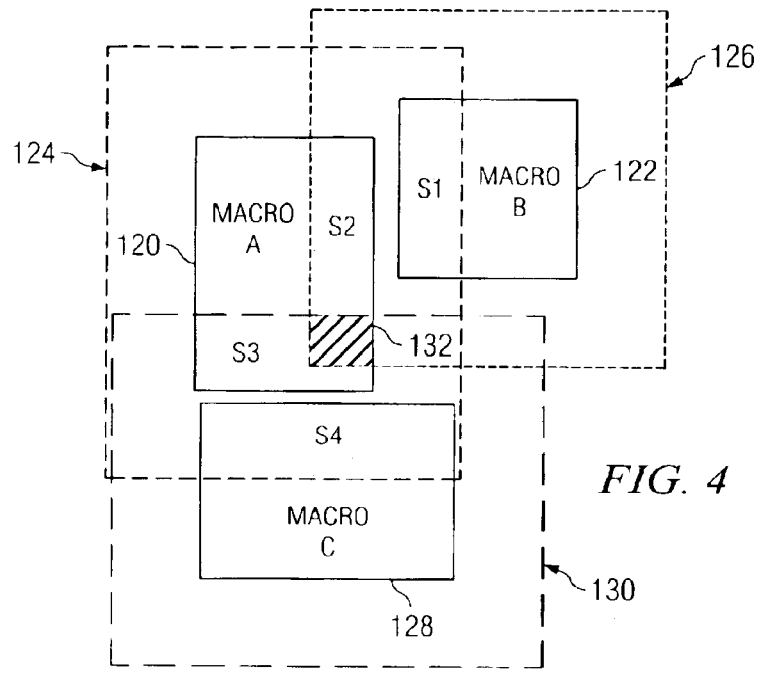
FIG. 4 depicts three neighboring macros and their respective logical boundary boxes.

Referring now to FIG. 4, there is shown an additional Macro C at 128 and having a boundary box 130. It can be seen that part of Macro A is within Macro C's boundary box 130, as shown by cross-hatched area S3. Also, part of Macro C is within Macro A's boundary box 124, as shown by cross-hatched area S4. Now, part of area S2 is shared by both Macro B and Macro C at 132, so the union of areas S2 and S3 are shared by all three Macros A, B and C. On the other hand, Macro A's boundary box covers part of Macro B (at S1) and Macro C (at S4), so Macro B and C share part of their capacitance with Macro A as well. The effective (after sharing) intrinsic capacitance of Macro A equals the original (without sharing) capacitance of Macro A plus the sharing of capacitance under area S1 and S4, less the sharing of area S2 and S3. As can be appreciated, the problem becomes more complicated as the sharing involves more macros.

For the general case, assume that for every macro, there are M macros sharing all or part of its intrinsic capacitance. To calculate one macro's effective capacitance, the complexity is M*M. Assuming that there are a total of N macros on the chip, the complexity is M*M*N, if all N macros are evaluated macro by macro. To reduce the complexity, a different approach is taken. An example will now be shown for three macros. The effective capacitance of each macro is defined as follows:

Effective Capacitance (A)=original capacitance (A)−sharing of A(S2, S3)+sharing of B(S1)+sharing of C(S4)

Effective Capacitance (B)=Original capacitance (B)−sharing of B(S1)+sharing of A(S2)

Effective Capacitance (C)=Original capacitance (C)−sharing of C(S4)+sharing of A(S3)

If we just evaluate Macro A, the value of the following parameters are known: (i) original capacitance (A); (ii) sharing of A(S2, S3); (iii) sharing of A(S2); and (iv) sharing of A(S3). Sharing of A(S2, S3) can be distributed to Macro B and C when A is evaluated, so that we have the following when evaluating Macro A:

Effective Capacitance (A)=Original capacitance (A)−sharing of A(S2, S3)

Effective Capacitance (B)=+sharing of A(S2)

Effective Capacitance (C)=+sharing of A(S3)

When evaluating Macro B, we distribute the sharing of B(S1) to Macro A, resulting in the following when evaluating Macro B:

Effective Capacitance (A)=Original capacitance (A)−sharing of A(S2, S1)+sharing of B(S1)

Effective Capacitance (B)=Original capacitance (B)−sharing of B(S1)+sharing of A(S2)

Effective Capacitance (C)=+sharing of A(S3)

When evaluating Macro C, the result is:

Effective Capacitance (A)=Original capacitance (A)−sharing of A(S2, S3)+sharing of B(S1)+sharing of C(S4)

Effective Capacitance (B)=Original capacitance (B)−sharing of B(S1)+sharing of A(S2)

Effective Capacitance (C)=Original capacitance (C)−sharing of C(S4)+sharing of A(S3)

As can be seen, the complexity has been reduced to M*N.

Tuning the Boundary Box Radius (Step 114)

Figure 5:
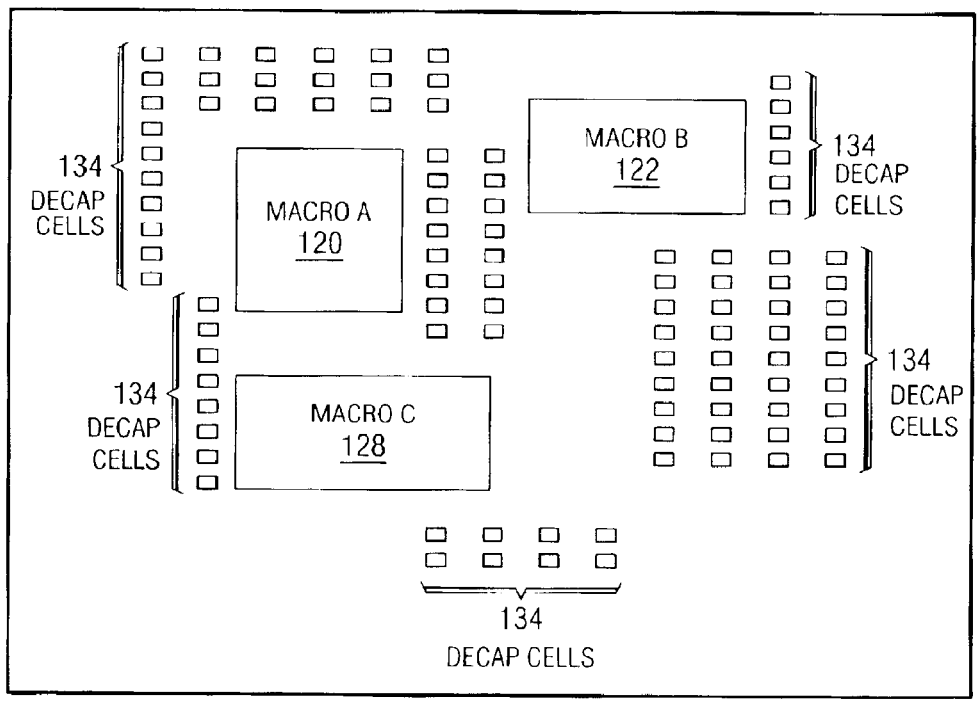
FIG. 5 depicts three neighboring macros and a plurality of decoupling capacitor (decap) cells.
Figure 6:
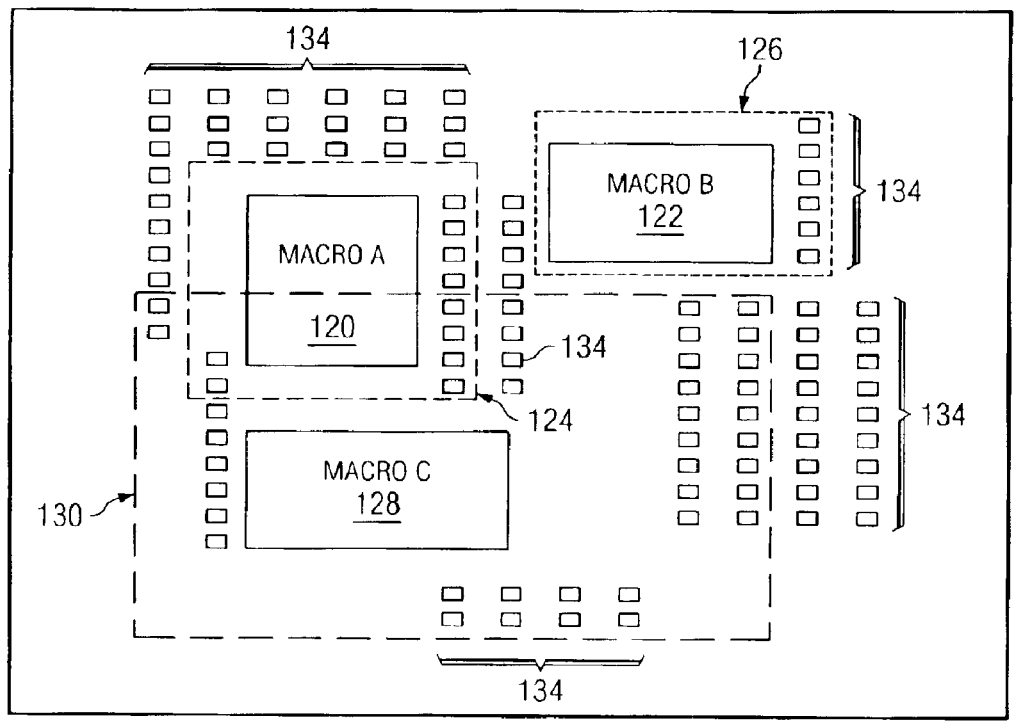
FIG. 6 depicts three neighboring macros and their associated initial logical boundary boxes.

For noise reduction, decoupling capacitor cells are generally added to the placed macros, as shown by elements 134 in FIG. 5. Hence, these are also contained within a boundary box as indicated in FIG. 6. The quiet capacitance available to counteract the noise of any given macro is dependent on the size of the boundary box assigned to this given macro. Since these boundary boxes in a typical dense design are overlapping with each other, the size of each boundary box needs to be tuned for the respective macro, such that the capacitance in the boundary box is just sufficient to meet its noise target. As one macro's boundary box shrinks, some decoupling capacitance is freed up for other macros, and in turn has a ripple affect on all macros' boundary box sizes. To effectively solve this multi-body problem, a method of trial and error is employed. A solution is typically reached in less than forty iterations in the preferred embodiment.

Figure 7:
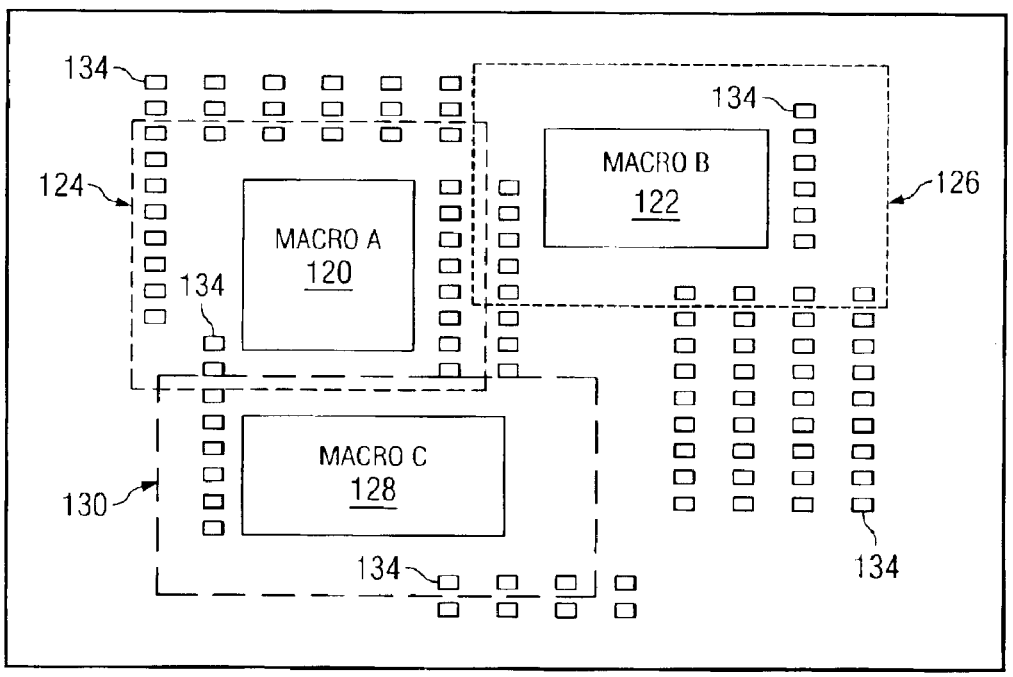
FIG. 7 depicts three neighboring macros and their associated logical boundary boxes after an initial tuning to account for projected noise.
Figure 8:
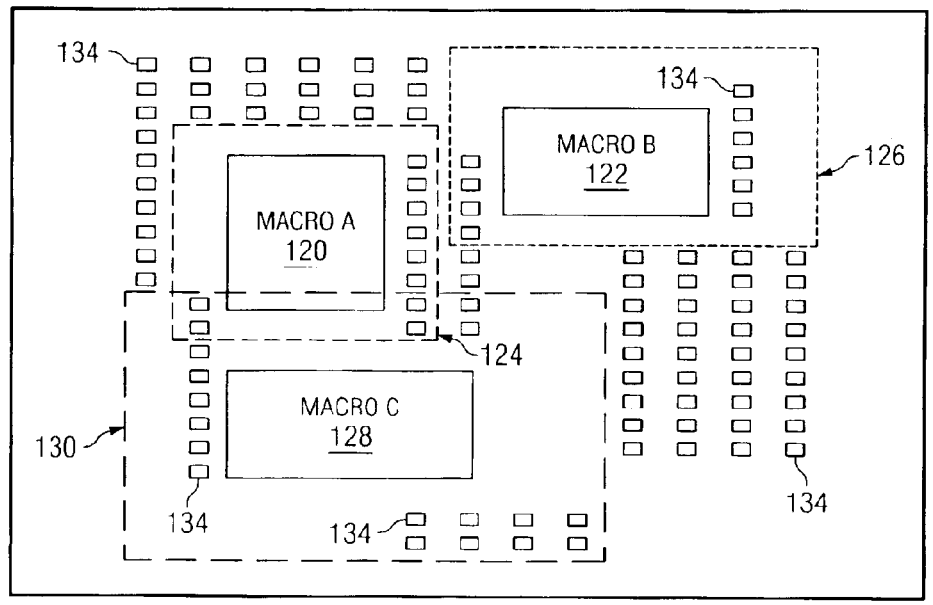
FIG. 8 depicts three neighboring macros and their associated logical boundary boxes after final tuning to account for projected noise.

An example of this process will now be described. Referring again to FIG. 5, there is shown a chip having three macros and ninety-nine decap cells. Each macro 120, 122 and 128 is initially assigned an initial boundary box size based on its noise projection, as depicted by boundary boxes 124, 126 and 130 in FIG. 6. For purposes of this example, decap cells in the overlap region of bounding boxes 124 and 130 are regarded as being shared equally between macros There are ten decaps for Macro A, six decaps for Macro B, and forty four decaps for Macro C. Using this information, the noise for each macro is projected again. If a macro's newly projected noise level is below its target, its boundary box is decreased to free up unneeded decaps. If a macro's newly projected noise level is above its target, its boundary box is increased to capture more decaps. The possible range of the boundary box size depends on power grid and decap response time, and is typically zero to five hundred microns in the preferred embodiment. Assume the noise of Macro A and B are above the noise target, meaning they need more decap cells, and the projected noise of Macro C is under the noise target, so that it can free some decaps by shrinking its boundary box size. After the boundary box sizes have been adjusted accordingly, Macro A has twenty three decaps, Macro B has fifteen decaps, and Macro C has nine decaps, as shown in FIG. 7. The noise projection is then repeated, and the boundary box sizes for the macros are re-tuned When the final solution is reached (in the preferred embodiment, after forty iterations), as shown in FIG. 8, those macros with maximum boundary box sizes (given by the hard distance limit), are considered as failing to meet set noise targets, whereas all other macros are within the noise limit.

Improvement of Noise Reduction

Once areas on the chip are identified where the macros fail set noise targets, several different steps can be taken. Different approaches are needed depending on the status of the chip design. Early in the design cycle, floor plan changes (e.g. spacing out macros in those problem areas identified above) are preferred. In the later stages of the design, basic changes of the floor plan will have a more significant impact on schedule and hence a less intrusive approach is desired.

Figure 9:
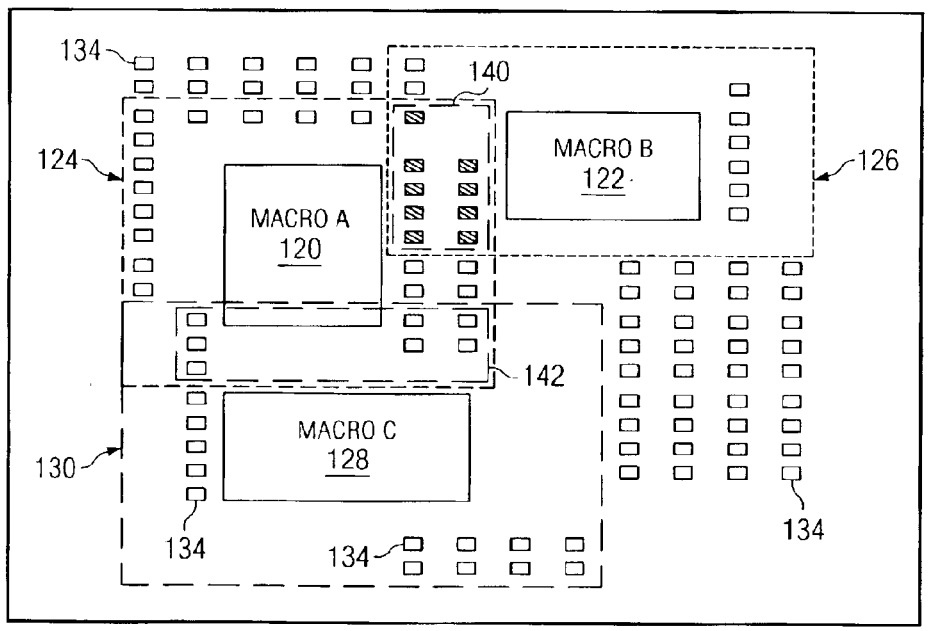
FIG. 9 depicts decap cells identified for replacement to a different type of decap cell.

The particular technology being used for the IC chip can provide several types of decoupling capacitors which may differ, for example, in their capacitance density or response behavior. Exchanging capacitance types in critical areas (e.g. replace thick oxide cap with thin oxide cap, deep-trench caps, or active caps) near these macros can dramatically improve the local noise problem. However, the use of these high performance caps typically come at a higher cost, such as design complexity, more leakage current or lower device yield, such that only a limited amount of usage of these high performance caps is acceptable. Therefore, these are placed at strategic places where they will be most effective. For example, as shown in FIG. 9, some decap cells in the Macro A boundary box 124 need to be replaced (since Macro A and B are failing their noise targets in this example). Replacing decap cells in circled area 140 is the most effective because they are shared by two macros that are both having noise problems. Decap cells in circled area 142 are a secondary choice for replacement because they are shared by Macro A and Macro B. Although Macro C met its noise target, it is always better to have less noise. In addition, the added capacitance introduced by the replaced decap cells may allow further shrinkage the Macro C boundary box, which in turn would free up more decaps which can then be used to reduce the noise of Macro A and/or Macro B.

Noise Projection (Given Macro ac Power, Dimension, Decaps) 112

To quantify the noise created by a macro—which is used for the initial noise projection and the noise projection after adding decap, a detailed equivalent model of the on-chip power distribution grid is extracted and simulated. In today's high performance digital integrated circuits, the power distribution network is set up as multilayer grids. In such a grid, and on each layer, straight vdd/gnd intedigitated lines (which are orthogonal to lines in adjacent layers) run the length of the chip and connect to the appropriate vdd/gnd lines above/below it through vias. This physical structure is input into a R,L,G,C extraction tool and an equivalent resistance/unit length, inductance/unit length and capacitance/unit length of the mesh is extracted for each of the orthogonal directions.

Figure 10:
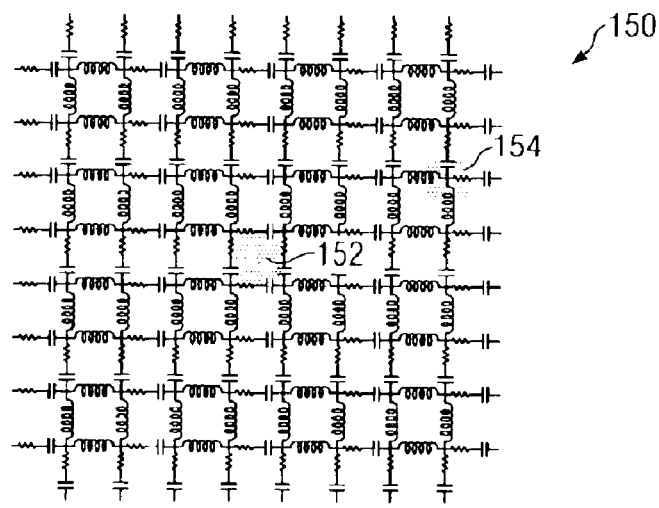
FIG. 10 depicts an equivalent circuit RLC grid used for simulating macro and decap cell characteristics.
Figure 11:
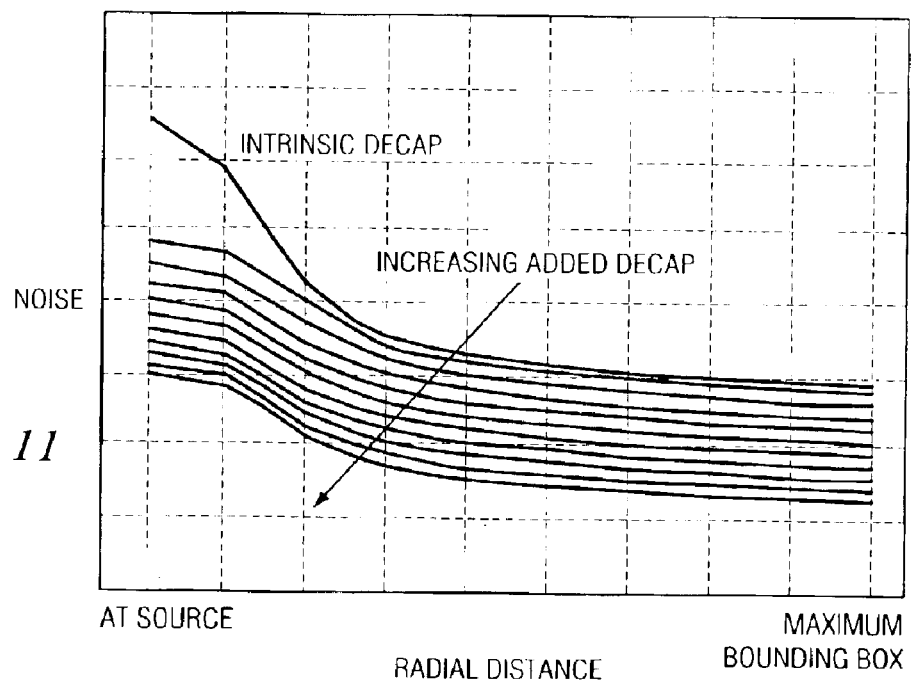
FIG. 11 depicts simulated on-chip noise for a given macro size/power as a function of boundary box radial distance from the macro and the added on-chip decap.

Using these extracted parameters, an equivalent circuit simulation deck is setup, as shown in FIG. 10. On this RLC grid, whose granularity can be determined by the detail required, the equivalent circuit elements for the switching macro 152 and intrinsic/added cap 154 are hooked at the appropriate nodes. This setup is then simulated and the peak noise and time of occurrence is stored. The sensitivity of the noise created is simulated as a function of (i) macro power, (ii) macro size, and (iii) added decap. These parameters are varied one parameter at a time during simulation, and the results are stored for subsequent use in noise projections. For example, as shown in FIG. 11, each curve depicts the on-chip noise as a function of boundary box radial distance from the source (from zero to the maximum bounding box) for a given macro size, power and on-chip decap. The family of curves is for different added on-chip decoupling capacitance (the parameter being varied). The top most curve represents the macro's original intrinsic capacitance, with each subsequent curve depicting projected noise for increasingly added decap.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for physical layout of an integrated circuit device having a plurality of functional blocks, comprising the steps of:
   defining a logical boundary box around each of at least some of the plurality of functional blocks;
   projecting noise associated with each of the logical boundary boxes;
   tuning size of the logical boundary boxes based upon the projected noise;
   projecting noise associated with each of the tuned logical boundary boxes; and
   retuning size of at least some of the logical boundary boxes based on the projected noise of the tuned logical boundary box.

2. The method of claim 1, wherein the step of tuning size of the logical boundary boxes comprises increasing size of logical boundary boxes having a projected noise that exceeds a threshold, and decreasing size of logical boundary boxes having a projected noise that is below the threshold.

3. The method of claim 1, further comprising the step of:
   for at least one of the tuned logical boundary boxes having projected noise above a threshold, swapping a decoupling capacitor within the tuned logical boundary box with a decoupling capacitor having different properties.

4. The method of claim 3, further comprising the step of:
   after the swapping step, reducing size of the logical boundary box containing the swapped decoupling capacitor in order to reduce decap associated with the logical boundary box.

5. The method of claim 4, wherein decoupling capacitors freed up by the reducing size step are used to reduce noise of another function block of the integrated circuit device.

6. The method of claim 5, wherein at least one of the freed up decoupling capacitors are physically moved to adjoin the another functional block.

7. A system for physical layout of an integrated circuit device having a plurality of functional blocks, comprising:
   means for defining a logical boundary box around each of at least some of the plurality of functional blocks;
   means for projecting noise associated with each of the logical boundary boxes;
   means for tuning size of the logical boundary boxes based upon the projected noise;
   means for projecting noise associated with each of the tuned logical boundary boxes; and
   means for retuning size of at least some of the logical boundary boxes based on the projected noise of the tuned logical boundary box.

8. A method for physical layout of an integrated circuit device having a plurality of functional blocks, comprising the steps of:
   defining a logical boundary box around each of at least some of the plurality of functional blocks, each of the logical boundary boxes also containing at least one decoupling capacitor;
   evaluating total capacitance for each of the logical boundary boxes;
   projecting noise associated with each of the logical boundary boxes;
   tuning size of the logical boundary boxes based upon the projected noise;
   projecting noise associated with each of the tuned logical boundary boxes; and
   for at least one of the tuned logical boundary boxes having projected noise above a threshold, swapping a decoupling capacitor within the tuned logical boundary box with a decoupling capacitor having different properties.

9. The method of claim 8, wherein the step of tuning size of the logical boundary boxes comprises increasing size of logical boundary boxes having a projected noise that exceeds a threshold, and decreasing size of logical boundary boxes having a projected noise that is below the threshold.

10. The method of claim 8, further comprising the step of:
    after the swapping step, reducing size of the logical boundary box containing the swapped decoupling capacitor in order to reduce decap associated with the logical boundary box.

11. The method of claim 10, wherein decoupling capacitors freed up by the reducing size step are used to reduce noise of another function block of the integrated circuit device.

12. The method of claim 11, wherein at least one of the freed up decoupling capacitors are physically moved to adjoin the another functional block.

13. A method for analyzing physical layout of an integrated circuit device having a plurality of cells, comprising the steps of:
    defining a matrix of blocks for the integrated circuit device;
    associating the cells with each of the blocks for which the cells are at least partially contained within; and
    accessing only the cells associated with a given block when analyzing characteristics of the block.

14. The method of claim 13, wherein the plurality of cells comprise macro cells and decap cells, and further comprising the steps of:
    for at least one of the macro cells, defining a logical boundary box around the macro cell, the logical boundary box containing at least one decap cell;
    estimating noise for each logical boundary box; and
    adjusting size of at least one of the logical boundary boxes based upon the estimated noise.

15. The method of claim 14, further comprising the steps of:
    increasing size of at least one boundary box to add decap when the estimated noise exceeds a noise threshold.

16. The method of claim 14, further comprising the steps of:
    decreasing size of at least one boundary box to decrease decap when the estimated noise is below a noise threshold.

17. The method of claim 14, wherein the estimated noise is determined based upon intrinsic capacitance of the respective macro cell and at least some capacitance associated with an adjoining macro cell.

18. A system for analyzing physical layout of an integrated circuit device having a plurality of cells, comprising:
    means for defining a matrix of blocks for the integrated circuit device;
    means for associating the cells with each of the blocks for which the cells are at least partially contained within; and means for accessing only the cells associated with a given block when analyzing characteristics of the block.

19. The system of claim 18, wherein the plurality of cells comprise macro cells and decap cells, and further comprising:

means for defining a logical boundary box around each of at least one macro cell, the logical boundary box containing at least one decap cell;

means for estimating noise for each logical boundary box; and means for adjusting size of at least one of the logical boundary boxes based upon the estimated noise.

20. A method for analyzing physical layout of an integrated circuit device, comprising the steps of:

providing a layout of cells for the integrated circuit device;

defining a matrix of blocks for the integrated circuit device which logically overlay the layout of cells; and associating the cells with each of the blocks for which the cells are at least partially contained within.

21. The method of claim 20, further comprising the step of:

accessing only the cells associated with a given block when analyzing characteristics of the block.

22. The method of claim 20 wherein the plurality of cells comprise macro cells and decap cells, and further comprising the steps of:

for at least one of the macro cells, defining a logical boundary box around the macro cell; and determining what blocks are within the logical boundary box and, for each such block, accessing the associated cells for such block to analyze characteristics associated with the logical boundary box.

23. A system for analyzing physical layout of an integrated circuit device, comprising:

means for providing a layout of cells for the integrated circuit device;

means for defining a matrix of blocks for the integrated circuit device which logically overlay the layout of cells; and means for associating the cells with each of the blocks for which the cells are at least partially contained within.

24. The system of claim 23, further comprising:

means for accessing only the cells associated with a given block when analyzing characteristics of the block.

25. A computer program product on a computer readable medium for analyzing physical layout of an integrated circuit device, comprising:

means for providing a layout of cells for the integrated circuit device;

means for defining a matrix of blocks for the integrated circuit device which logically overlay the layout of cells; and means for associating the cells with each of the blocks for which the cells are at least partially contained within.

* * * * *